United States Patent [19]
Murphy
[11] Patent Number: 4,985,989
[45] Date of Patent: Jan. 22, 1991

[54] METHOD AND APPARATUS FOR REMOVING A MULTI-PIN COMPONENT INSTALLED IN SOCKETS ON A CIRCUIT BOARD

[75] Inventor: James V. Murphy, Warwick, R.I.

[73] Assignee: Advanced Interconnections Corporation, West Warwick, R.I.

[21] Appl. No.: 434,006

[22] Filed: Nov. 9, 1989

[51] Int. Cl.[5] .......... H05K 3/30
[52] U.S. Cl. .......... 29/829; 29/264; 29/266; 29/426.4; 29/764
[58] Field of Search .......... 29/764, 266, 264, 829, 29/825, 837–839, 426.4

[56] References Cited

U.S. PATENT DOCUMENTS

| | | | |
|---|---|---|---|
| 3,588,983 | 6/1971 | Hoy | 29/764 |
| 4,173,813 | 11/1979 | Stockinger | 29/266 |
| 4,597,173 | 7/1986 | Chino et al. . | |
| 4,633,239 | 12/1986 | Nalbanti . | |
| 4,800,647 | 1/1989 | Guyer | 29/764 X |
| 4,832,610 | 5/1989 | Matsuoka . | |

OTHER PUBLICATIONS

"Removing A Bushing From A Blind Hole"; 5-4-22; W. H. Storey; American Machinist, vol. 55, p. 978.
Method Electronics, Inc. product literature.
Augat's product literature, TX Series.
Augat's product literature, TI/TW Series.
Emulation Technology, Inc. product literature.
Micro Electronic System's product literature.
Hypertac Limited's product literature.
Hypertonics Corporation product literature, KS Series.
J. L. Horvath et al., IBM Technical Disclosure Bulletin.
Electronics Purchasing (October, 1989) p. 54.
Detroit Molding Engineering product literature.

*Primary Examiner*—Carl E. Hall
*Attorney, Agent, or Firm*—Fish & Richardson

[57] ABSTRACT

An apparatus for removing a multi-contact component installed in sockets on a circuit board. The apparatus includes at least one elongated post for providing an upward force on the lower surface of the component to remove the component from the sockets. The logitudinal axis of the post is generally normal to the lower surface of the component. At least one screw is mechanically coupled to the post so that rotation of the screw causes longitudinal movement of the post.

13 Claims, 8 Drawing Sheets

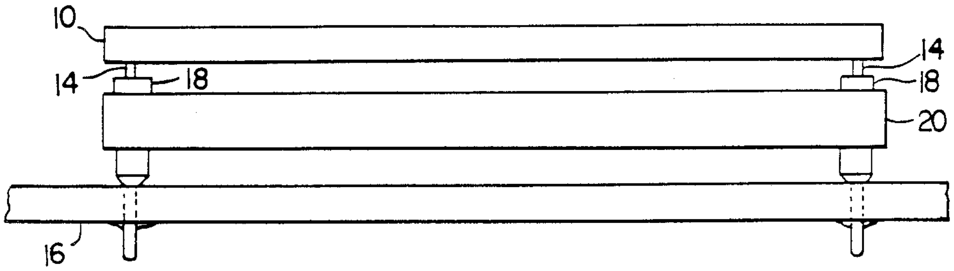
FIG. 1d
(PRIOR ART)
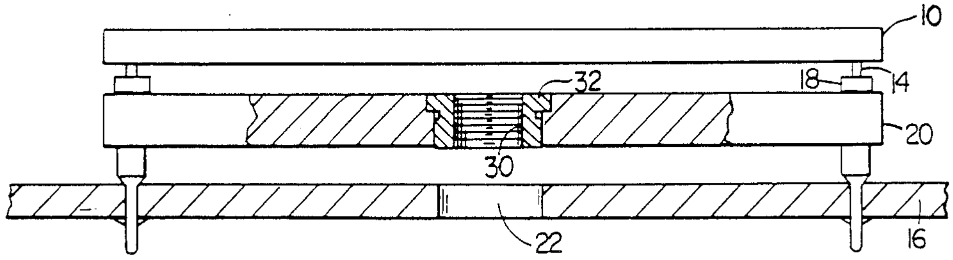
FIG. 2a
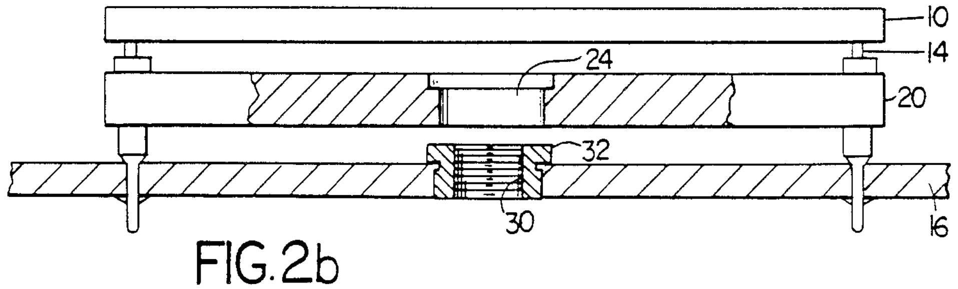
FIG. 2b
FIG. 2c
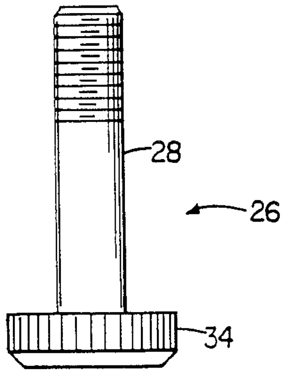

METHOD AND APPARATUS FOR REMOVING A MULTI-PIN COMPONENT INSTALLED IN SOCKETS ON A CIRCUIT BOARD

BACKGROUND OF THE INVENTION

The invention relates to removing multi-pin components installed in sockets on circuit boards.

For a variety of reasons, manufacturers of electronic circuit boards often use sockets as a means for connecting integrated circuits (ICs) to a circuit board. While the forces associated with the engagement of a single IC pin with its companion socket are insignificant, the aggregate forces due to a large number of pins, e.g., in a pin grid array (PGA) can make extraction of the IC so difficult that special extraction tools are necessary. Known IC extraction tools operate to grip the edges of the body of the IC and pull the IC away from the sockets.

SUMMARY OF THE INVENTION

In general, in one aspect, the invention features removing a multi-pin component using a screw mechanically coupled to an elongated post for providing an upward force on the lower surface of the component. Rotation of the screw causes longitudinal movement of the post and upward movement of the component.

Preferred embodiments include the following features. The apparatus includes mating screw threads wherein one screw thread is on the post and the other screw thread is on a nut for installation on the circuit board or on the body in which the sockets are supported. The circuit board has a hole, aligned with the nut, through which the post extends. A handle is provided for turning the screw. The post is generally normal to the lower surface of the component.

Alternatively, the other screw thread may be on a threaded member with flexible arms. The arms flex inwardly to permit the member to pass through holes in at least one of the circuit board and body. The arms move outwardly thereafter to engage the load bearing surface on one of the circuit board and body. A bearing plate at the longitudinally upper end of post, is supported on its underside by the post. The plate has an upper surface for contacting the lower surface of the component for distributing the upward force over the area of the lower surface which is in contact with the upper surface.

Alternatively, a plate is connected to the longitudinally lower end of a plurality of posts to mechanically couple at least one screw to the posts so that rotation of the screw causes longitudinal movement of the posts. The plate is positioned above the printed circuit board and beneath the multiple contact component. The plate includes a plurality of apertures. Each aperture is sized and shaped to accommodate the body of a socket so that the plate can move longitudinally along an axis of the socket in response to rotation of the screw. The plate includes at least one threaded aperture for mating with a threaded jack screw.

DESCRIPTION OF THE PREFERRED EMBODIMENT

Drawings

Figure 1C:
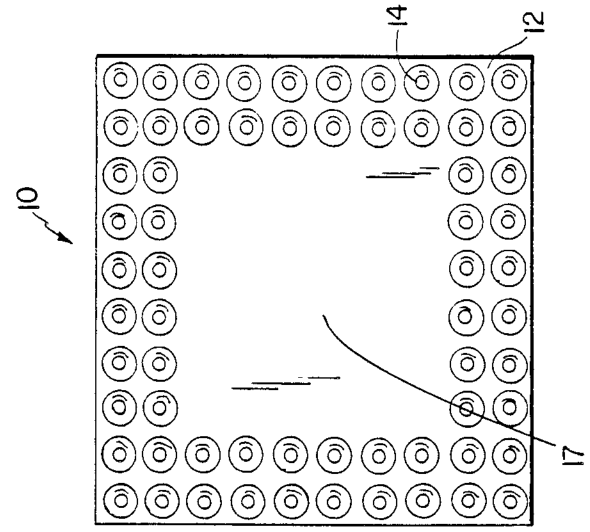
FIG. 1c (PRIOR ART)
Figure 1B:
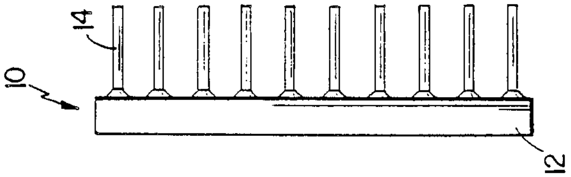
FIG. 1b (PRIOR ART)
Figure 1A:
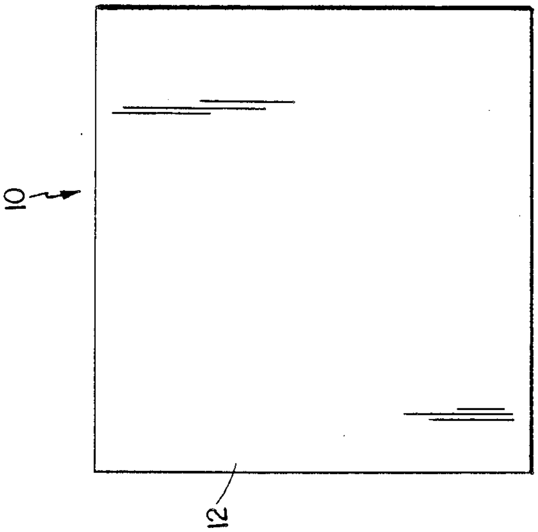
FIG. 1a (PRIOR ART)

FIGS. 1*a*, 1*b*, and 1*c* are top, side and bottom views respectively of a prior art PGA.

FIG. 1*d* is a side view of a prior art circuit board assembly.

FIGS. 2*a* through 8*a* are cross-sectional side views showing various embodiments in exploded and assembled states.

Figure 8A:
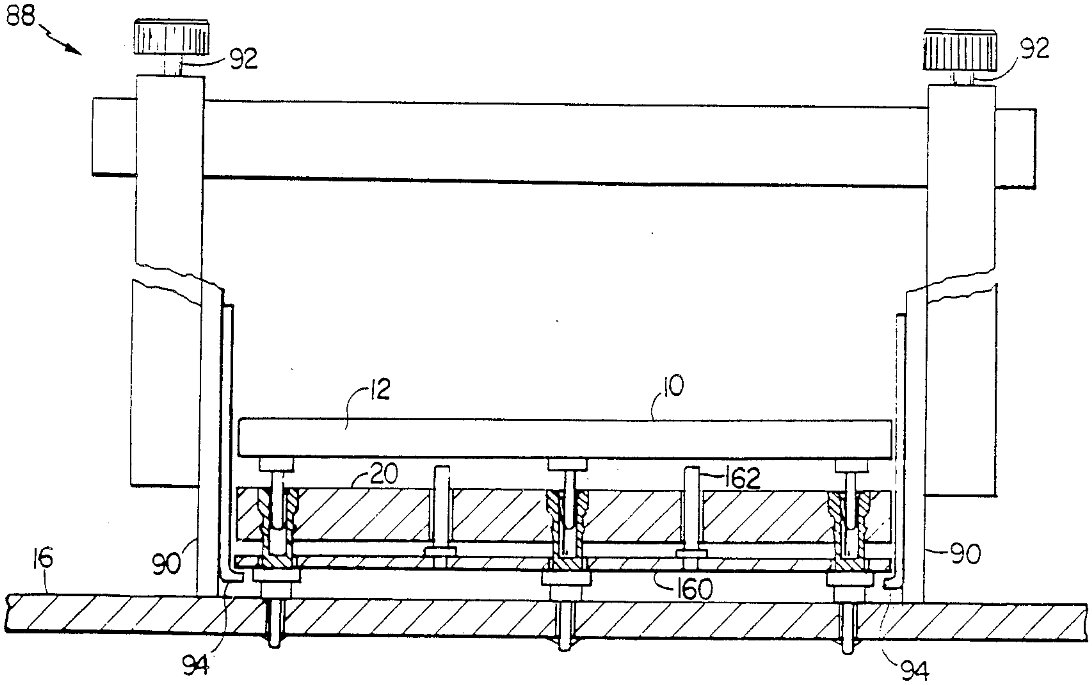
Figure 8B:
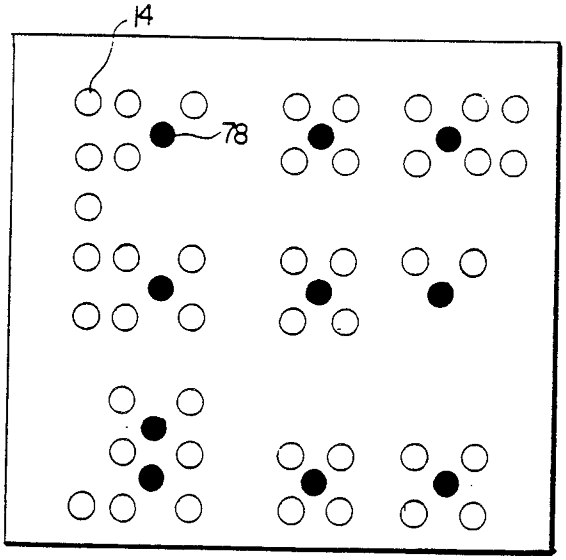

FIG. 8*b* is a bottom view of a prior art pin grid array wherein solid circles represent the points on the bottom surface of the pin grid array which contact the posts of the knockout plate.

Referring to FIGS. 1*a*–1*c*, an IC having a large number of pins is often packaged as a pin grid array (PGA) 10. PGA 10 includes a ceramic body 12which supports a group of male contact pins 14. The pins may be arranged in a variety of footprints. A common footprint shown in FIG. 1*c* includes a desert region 17 containing no pins.

Referring to FIG. 1*d*, a PGA 10 is often mounted to a printed circuit board 16 by inserting each pin 14 of the PGA into a corresponding socket 18, which is soldered into a plated through hole of the printed circuit board. The sockets are often supported in a molded plastic body 20 that is left in place.

Referring to FIGS. 2*a*–2*c*, PGA 10 can be extracted by providing openings 22,24 in the printed circuit board 16 and carrier 20, respectively. Openings 22,24 are positioned beneath the inserted PGA 10, in the vicinity of a desert region (i.e., a region in which there are no pins extending from the PGA), and a knockout post of an extraction tool is passed through the openings to push PGA 10 out of sockets A variety of extraction tools may be employed. FIG. 2*c* depicts an extraction jack screw 26 having a threaded knockout post 28. The inner walls of at least one of openings 22,24 are provided with a female thread 30 for mating with threaded knockout post 28. The threads are provided by a Pem nut 32 pressed into either carrier 20 or printed circuit board 16. In the event that no carrier is present, as when a removable carrier is employed in installing the sockets, the Pem nut is pressed into the circuit board.

To remove PGA 10, threaded knockout post 28 is screwed into mating thread 30 until knockout post 28 contacts desert region 17 of PGA 10. Further turning of the threaded knockout post 28 operates to push PGA 10 out of sockets 18. To provide the mechanical advantage needed to overcome the forces resisting removal of PGA 10, threaded knockout post 28 is attached to a gripping knob 34 having a diameter which is large relative to the diameter of driving post 28.

Figure 3A:
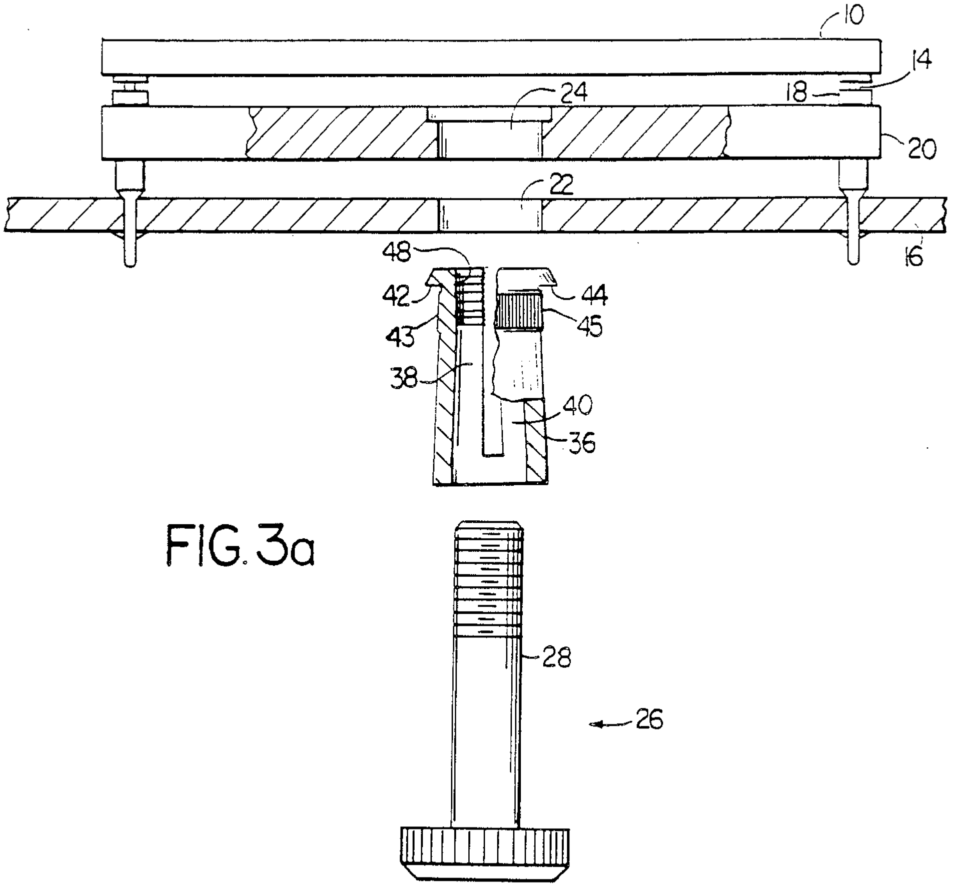
Figure 3B:
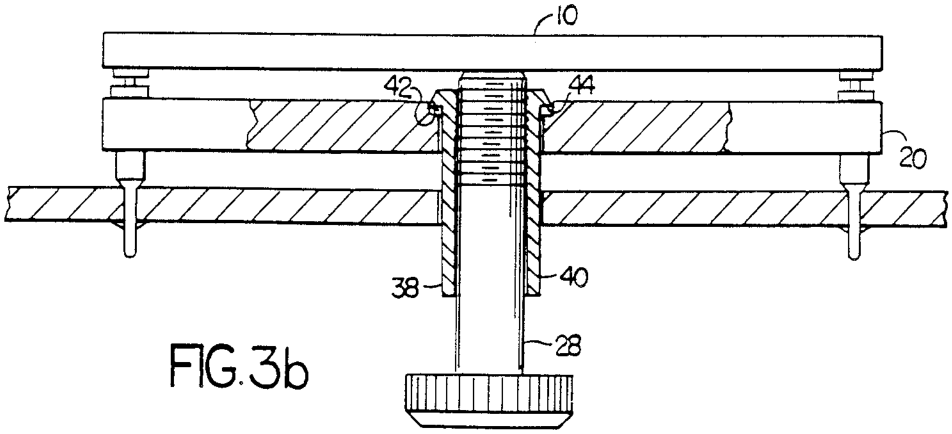

Referring to FIGS. 3*a* and 3*b*, threaded walls may be provided by removable pinch nut 36. Pinch nut 36 has a pair of tongues 38,40 which press together to allow insertion of the tongues through opening 22. In the embodiment shown, the tongues are long enough to further extend through opening 24. Each tongue contains a lip 42,44 and a roughened surface 43,45. As threaded post 28 is screwed into threads 48 of pinch nut 36, the tongues spread apart, pushing lips 44,46 over the top surface of carrier 20 as depicted in FIG. 3*b* and pressing the roughened surfaces against the wall of opening 24. As post 28 engages the bottom surface of PGA 10, lips 44,46 are driven down, against the top surface of carrier 20, thereby providing the effective floor on which threaded post 28 stands as it pushes PGA 10 out of the sockets.

Figure 4A:
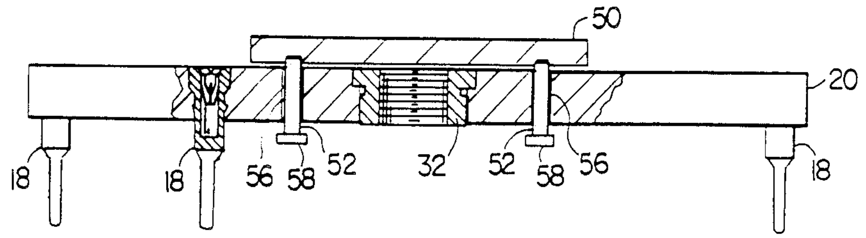
Figure 4B:
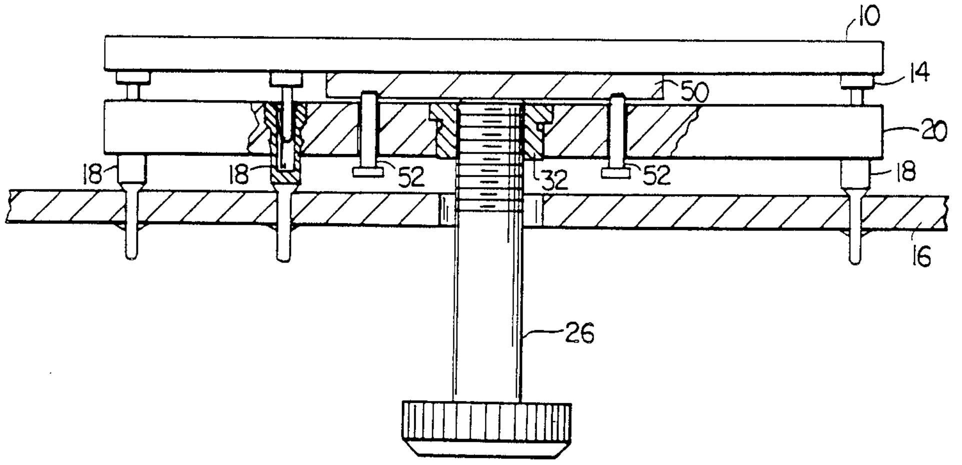

In some applications, it may be desireable to distribute the force of threaded post 28 over a wider area of the bottom surface of PGA 10. Referring to FIGS. 4*a* , and 4*b*, a rigid knockout plate 50 may be secured to carrier 20 in a manner which allows the plate to move with threaded post 28 to drive PGA out of its socket. The knockout plate is chosen to have a larger surface than post 28 to thereby lessen the strain on the ceramic body of PGA 10. A variety of means may be employed to secure plate 50 to carrier 20, e.g., a pair of guide rods 52 disposed in apertures 56 in carrier 20. Guide rods 52 may be terminated with stops 58 for holding the rods and plate to the carrier as a single subassembly.

Figure 5A:
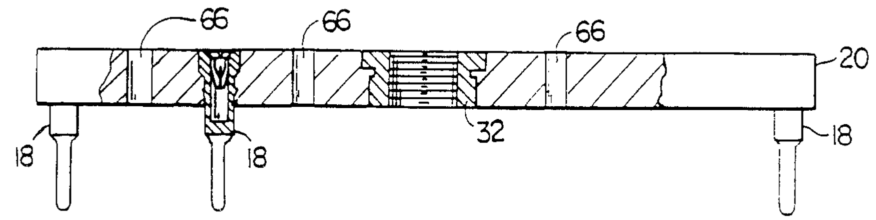
Figure 5B:
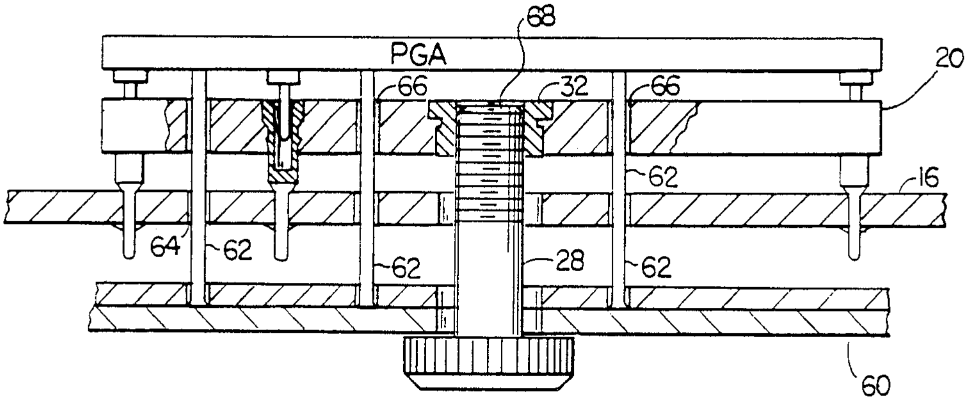

FIG. 5*b*, depicts an alternative knockout plate 60 for distributing the force of extraction beyond the desert region into regions having pins. In the embodiment shown in FIGS. 5*a* and 5*b*, knockout posts 62 of knockout plate 60 pass through apertures 64 in the printed circuit board and apertures 66 in carrier 20 to engage upon the bottom surface of PGA 10 in a variety of regions between the PGA pins. Knockout plate 60 is attached to a threaded knockout post 28 such that posts 62 operate to lift the PGA out of its socket as the threaded post is screwed into Pem nut 32. Posts 62 are sufficiently long that the end 68 of threaded post 28 will not touch the ceramic body of PGA 10 during extraction.

Figure 6A:
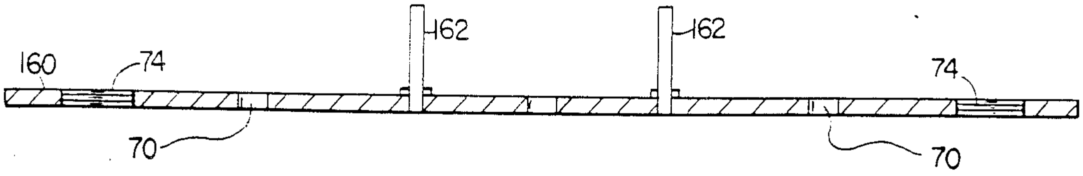
Figure 6B:
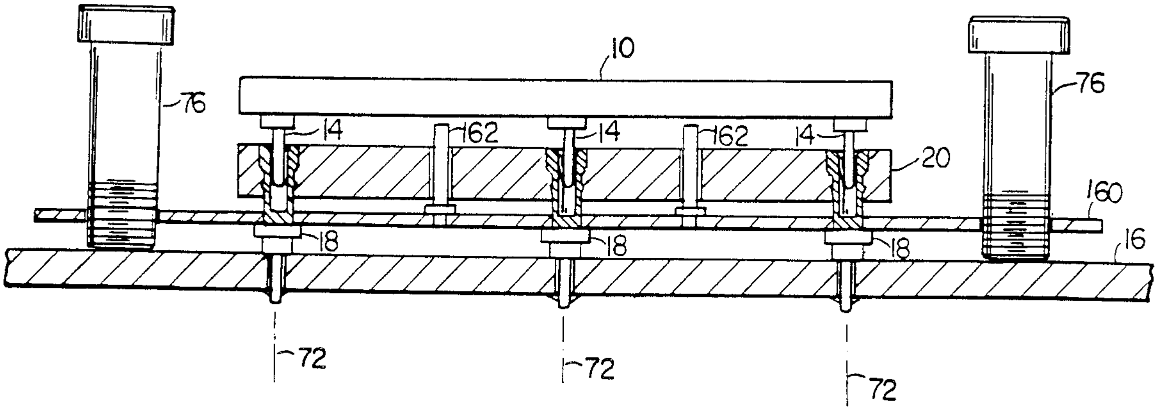

The above described embodiments are specifically directed to PGAs having desert regions large enough to accommodate a knockout post or plate. Many PGAs however are densely populated with a forest of pins, providing no desert region for use as a knockout surface. FIGS. 6*a* and 6*b*, depict a knockout plate 160 for removing such PGAs. Knockout plate 160 includes apertures 70 for mating with sockets 18 to allow the knockout plate 160 to move along axis 72 of sockets 18. The knockout plate extends beyond PGA 10 and socket carrier 20 to allow threaded jack screws 76 to access threaded holes 74. As jack screws 76 bear down on the top surface of printed circuit board 16, they operate to lift knockout plate 160. Knockout posts 162 engage the bottom of PGA 10, lifting it from the sockets.

Figure 7:
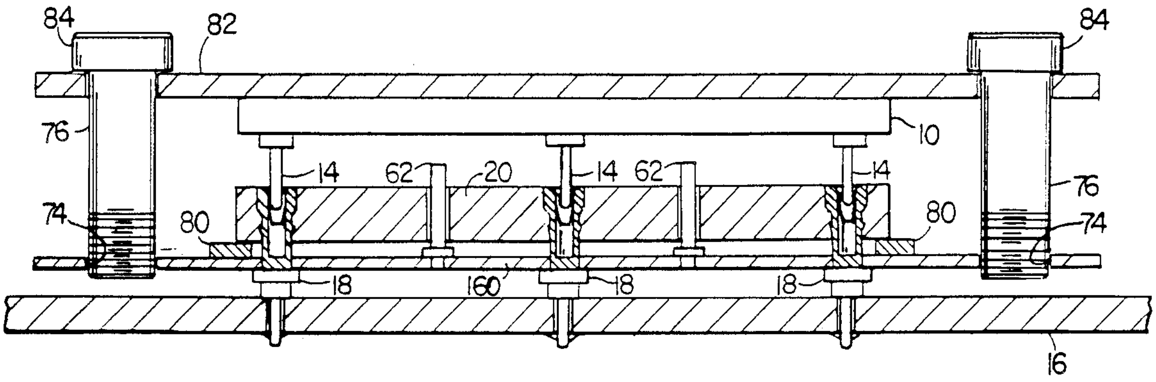

The embodiment shown in FIGS. 6*a* and 6*b* may also be employed as a means for inserting PGA 10. Referring to FIG. 7, during insertion, hold down blocks 80 are placed between carrier 20 and knockout plate 160. Pull down cover 82 is placed across the top surface of PGA 10, beneath the heads 84 of threaded jack screws 76. As jack screws 76 are screwed into threaded holes 74, knockout plate 160 rises until hold down blocks 80 are pressed against the underside of carrier 20. Since knockout plate 160 can rise no further, continued rotation of jack screws 76 operates to force pull down cover 82 against the top surface of PGA I0, thereby pressing pins 14 of PGA I0 into sockets 18.

Referring to FIG. 8*a*, knockout plate 160 may also be employed with a conventional extraction tool 88. Conventional extraction tool 88 includes a support leg 90 for standing on the top surface of printed circuit board 16 An extraction screw 92 is connected to lifting hook 94 to lift the hook as the extraction screw 92 is turned. When used in a conventional manner, the lifting hook grips the underside of PGA 10, thereby lifting it from sockets 18. However, this puts an unnecessarily large strain on ceramic body 12 of PGA 10. In the embodiment shown in FIG. 8*a*, lifting hook 94 grips the underside of knockout plate 160, thereby lifting plate 160 to extract PGA 10.

Referring to FIG. 8*b*, knockout posts 162 engage the bottom surface of the ceramic body 12 of PGA 10 at a variety of points 78 in the interstices of the forest of pins 14. Knockout plate 160 accordingly distributes the extraction force over the body 12 of PGA, thereby eliminating unnecessary strain.

Other embodiments are within the following claims. For example, there are a great many different ways in which the screw (by which rotary motion is translated into vertical motion of the multi-pin component) and the mechanical coupling of the screw to the posts that exert force on the component may be implemented.

What is claimed is:

1. Apparatus for removing a multicontact component installed in sockets on a circuit board, said component having a lower surface facing said circuit board, said apparatus comprising:

at least one elongated post for providing an upward force on said lower surface of said component to remove said component from said sockets, said at least one elongated post having a screw-threaded portion and at least one screw member mechanically coupled to said post so that rotation of said post causes longitudinal movement of said post toward said lower surface thereby effecting said upward force.

2. The apparatus of claim 1 wherein said screw member is a nut for installation on said circuit board.

3. The apparatus of claim 1 wherein said screw member is a nut for installation on a body in which said sockets are supported.

4. The apparatus of claim 3 further comprising said circuit board, wherein said circuit board has a hole aligned with said nut on said body and through which said post extends.

5. The apparatus of claim 1 wherein said screw member is a threaded member with flexible arms, said arms being capable of flexing inwardly to permit said member to pass through holes in at least one of said circuit board and body, and of moving outwardly thereafter to engage one of said circuit board and body.

6. The apparatus of claim 1 wherein there are a plurality of posts.

7. The apparatus of claim 1 further comprising a bearing plate at the longitudinally upper end of said at least one post, said bearing plate being supported on its underside by said post, and having an upper surface for contacting the lower surface of said component for distributing said upward force over the area of said lower surface which is in contact with said upper surface.

8. The apparatus of claim 6 further comprising a plate connected to the longitudinally lower end of said posts to mechanically couple said at least one screw to said posts so that rotation of said screw causes longitudinal movement of the posts.

9. The apparatus of claim 1 further comprising a handle for manual rotation of said at least one post.

10. The apparatus of claim 1 wherein the longitudinal axis of said post is generally normal to said lower surface of said component

11. The apparatus of claim 1 further comprising a plurality of posts without screw-threaded portions and further comprising a plate connected to the longitudinally lower end of said plurality of posts to mechanically couple said post with a said plurality of posts to mechanically couple said post with a screw-threaded portion to said plurality of posts so that rotation of said post with a screw-threaded portion causes longitudinal movement of the posts without screw-threaded portions and wherein the plate is positioned below the printed circuit board and the multiple contact component, said plate being coupled to said post with a screw-threaded portion so that said plate can move longitudinally along an axis of the socket.

12. A method for removing a multi-contact component installed in sockets on a circuit board, said component having a lower surface facing said circuit board, said method comprising:

positioning at least one elongated post beneath said multi-contact component so that upward movement of the post exerts an upward force on the lower surface of the component tending to remove the component from the sockets, said at least one post having a screw-threaded portion and mechanically coupling at least one screw member to the post so that rotation of the post causes longitudinal movement of the post toward said lower surface thereby effecting said upward force, and rotating the screw to move the post upwardly and thereby move the component out of engagement with the sockets.

13. The method of claim 12 further comprising positioning a bearing plate at the longitudinally upper end of said at least one post, said bearing plate being supported on its underside by said post, and having an upper surface for contacting the lower surface of said component for distributing said upward force over the area of said lower surface which is in contact with said upper surface.

* * * * *